United States Patent
Chao et al.

(10) Patent No.: US 10,644,045 B2
(45) Date of Patent: May 5, 2020

(54) PIXEL SENSING MODULE AND IMAGE CAPTURING DEVICE

(71) Applicant: Shenzhen Goodix Technology Co., Ltd., Shenzhen, Guangdong (CN)

(72) Inventors: Wei-Min Chao, Guangdong (CN); Chien-Jian Tseng, Guangdong (CN)

(73) Assignee: Shenzhen Goodix Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 16/158,279

(22) Filed: Oct. 11, 2018

(65) Prior Publication Data

US 2019/0123076 A1 Apr. 25, 2019

Related U.S. Application Data

(63) Continuation of application No. PCT/CN2017/107114, filed on Oct. 20, 2017.

(51) Int. Cl.
*H01L 27/146* (2006.01)
*H04N 5/374* (2011.01)

(52) U.S. Cl.
CPC .. *H01L 27/14605* (2013.01); *H01L 27/14627* (2013.01); *H01L 27/14629* (2013.01); *H01L 27/14641* (2013.01); *H04N 5/374* (2013.01); *H01L 27/14623* (2013.01); *H01L 27/14643* (2013.01)

(58) Field of Classification Search
CPC ......... H01L 27/14605; H01L 27/14627; H01L 27/14643; H01L 27/14629; H01L 27/14641; H01L 27/14623; H04N 5/374; H04N 5/2253; H04N 5/347
See application file for complete search history.

(56) References Cited

U.S. PATENT DOCUMENTS

| | | |
|---|---|---|
| 6,365,900 B1 | 4/2002 | Mestais |
| 2004/0218077 A1 | 11/2004 | Petrick |
| 2006/0011852 A1 | 1/2006 | El-Hanany |
| 2006/0138322 A1 | 6/2006 | Costello |
| 2010/0238330 A1 | 9/2010 | Hirota |
| 2011/0261239 A1 | 10/2011 | Costello |

(Continued)

FOREIGN PATENT DOCUMENTS

| | | |
|---|---|---|
| CN | 101854488 A | 10/2010 |
| CN | 102262237 A | 11/2011 |

(Continued)

*Primary Examiner* — Lin Ye
*Assistant Examiner* — Tuan H Le
(74) *Attorney, Agent, or Firm* — Winston Hsu

(57) ABSTRACT

The present application provides a pixel sensing module comprising a pixel light-sensing unit, receiving light at a light receiving side and outputting a pixel value, the pixel light-sensing unit comprising a plurality of sub-pixel light-sensing components configured to output a plurality of sub-pixel values; and an integrating unit, coupled to the pixel light-sensing unit configured to output the pixel value according to the plurality of sub-pixel values; and a collimating unit having a plurality of openings, wherein the plurality of openings are aligned with an area of the pixel light-sensing unit, and projections of the plurality of openings onto the light receiving side lie within the area of the pixel light-sensing unit at the light receiving side.

20 Claims, 4 Drawing Sheets

(56) References Cited

U.S. PATENT DOCUMENTS

| | | | |
|---|---|---|---|
| 2012/0001082 A1* | 1/2012 | Shoho | G01T 1/00 |
| | | | 250/369 |
| 2012/0113290 A1* | 5/2012 | Nakata | H04N 5/35554 |
| | | | 348/222.1 |
| 2013/0050562 A1* | 2/2013 | Nakata | G02B 5/201 |
| | | | 348/336 |
| 2013/0057744 A1* | 3/2013 | Minagawa | H04N 5/35563 |
| | | | 348/311 |
| 2016/0225827 A1 | 8/2016 | Park | |
| 2017/0090047 A1 | 3/2017 | Shahar | |
| 2017/0171470 A1* | 6/2017 | Sakioka | H01L 27/14607 |
| 2018/0184013 A1* | 6/2018 | Hamano | G06T 7/593 |
| 2019/0020838 A1* | 1/2019 | Hatakeyama | H04N 5/3698 |

FOREIGN PATENT DOCUMENTS

| | | |
|---|---|---|
| CN | 103312950 A | 9/2013 |
| CN | 103515397 A | 1/2014 |
| CN | 104221365 A | 12/2014 |
| CN | 105939439 A | 9/2016 |
| EP | 1 639 945 A1 | 3/2006 |
| EP | 2 833 623 A1 | 2/2015 |
| WO | 0246791 A1 | 6/2002 |

\* cited by examiner

PIXEL SENSING MODULE AND IMAGE CAPTURING DEVICE

CROSS REFERENCE TO RELATED APPLICATIONS

The present application is a continuation of international application No. PCT/CN2017/107114, filed on Oct. 20, 2017, of which is incorporated herein by reference in its entirety.

FIELD OF THE INVENTION

The present application relates to a pixel sensing module and an image capturing device, and more particularly, to a pixel sensing module and an image capturing device capable of enhancing light sensitivity.

BACKGROUND

CMOS image sensor (CIS) has been widely applied in electronic devices with image capturing function and digital camera. In general, the image sensor comprises a pixel sensing array, and the pixel sensing array comprises a plurality of pixel sensing unit arranged in an array. The pixel sensing unit comprises a light-sensing component, such as a photo diode or a photo transistor, and a converting circuit. The sensitivity of the pixel sensing unit is related/proportional to a light-sensing area of the light-sensing component. Take the pixel sensing unit comprising the photo diode as an example, the photo diode stores the electronic charges caused by the light in the potential well of the photo diode, and the electronic charges is converted by the converting circuit comprising transistors into voltage signal, where the voltage signal is the pixel value corresponding to the pixel sensing unit. Light sensitivity of the pixel sensing unit is related to an area of the photo diode in the circuit layout.

To achieve a specific light sensing capability for the image sensor, the pixel sensing unit is required to have a certain light sensing area. In the prior art, each pixel sensing unit only comprises a light sensing component. In other words, the only light sensing component of the pixel sensing unit has to have the required light sensing area of the pixel sensing unit. However, for the light sensing component with large light sensing area, the electronic charges within the potential well is not easy to be completely drained out by the converting circuit, such that the light-sensing component may have residual electronic charges, which may cause unnecessary image sticking effect on the digital camera. In addition, the image sensor comprises a collimator in general, configured to project the light onto the pixel sensing unit. However, the pixel sensing unit and the collimator are not perfectly aligned, such that crosstalk exists between light paths.

Therefore, it is necessary to improve the prior art.

SUMMARY

It is therefore an objective of embodiments of the present application to provide a pixel sensing unit and an image capturing device, to improve over disadvantages of the prior art.

To solve the problem stated in the above, an embodiment of the present application provides, the present application provides pixel sensing module, comprising a pixel light-sensing unit, receiving light at a light receiving side and outputting a pixel value, the pixel light-sensing unit comprising a plurality of sub-pixel light-sensing components, configured to output a plurality of sub-pixel values; and an integrating unit, coupled to the pixel light-sensing unit, configured to output the pixel value according to the plurality of sub-pixel values; and a collimating unit, having a plurality of openings, wherein the plurality of openings are aligned with an area of the pixel light-sensing unit, and projections of the plurality of openings onto the light receiving side lie within the area of the pixel light-sensing unit at the light receiving side.

For example, a first opening among the plurality of openings is aligned with at least a sub-pixel light-sensing component among the plurality of sub-pixel light-sensing components.

For example, the plurality of sub-pixel light-sensing components comprises a plurality of light-sensing areas and a plurality of non-light-sensing areas, a projection of the first opening onto the light receiving side coincides with at least a light-sensing area of the at least a sub-pixel light-sensing component.

For example, the plurality of sub-pixel light-sensing components comprises photo diodes.

For example, the integrating unit performs an average operation on the plurality of sub-pixel values, to output the pixel value as an average of the plurality of sub-pixel values.

For example, the integrating unit performs a summation operation on the plurality of sub-pixel values, to output the pixel value as a summation of the plurality of sub-pixel values.

For example, the integrating unit outputs the pixel value as a sub-pixel value among the plurality of sub-pixel values.

An embodiment of the present application provides image capturing device comprising a plurality of pixel sensing modules, arranged as an array, wherein each pixel sensing module comprises a pixel light-sensing unit, receiving light at a light receiving side and outputting a pixel value, wherein the pixel light-sensing unit has an area at the light receiving side, the pixel light-sensing unit comprises a plurality of sub-pixel light-sensing components, configured to output a plurality of sub-pixel values; and an integrating unit, coupled to the pixel light-sensing unit, configured to output the pixel value according to the plurality of sub-pixel values; a collimating unit, having a plurality of openings, wherein the plurality of openings are aligned with the area of the pixel light-sensing unit, and projections of the plurality of openings onto the light receiving side lie within the area of the pixel light-sensing unit at the light receiving side.

The present application utilizes the collimating unit having a plurality of openings aligned with the zone of the pixel light-sensing unit at the light receiving side so as to avoid crosstalk between the light paths and achieve the maximum light amount; and utilizes the plurality of sub-pixel light-sensing components of the pixel light-sensing unit to enhance the draining-out capability. Furthermore, the present application arranges the sub-pixel light-sensing components appropriately, such that the projections of the openings at the light receiving side (i.e., the light transmission zone) only overlap with the light-sensing areas of the sub-pixel light-sensing components and do not overlap with the non-light-sensing area of the plurality of sub-pixel light-sensing components, to achieve better light sensitivity.

These and other objectives of the present invention will no doubt become obvious to those of ordinary skill in the art after reading the following detailed description of the preferred embodiment that is illustrated in the various figures and drawings.

DETAILED DESCRIPTION

In order to make the objects, technical solutions and advantages of the present application become more apparent, the following relies on the accompanying drawings and embodiments to describe the present application in further detail. It should be understood that the specific embodiments described herein are only for explaining the present application and are not intended to limit the present application.

Figure 1:
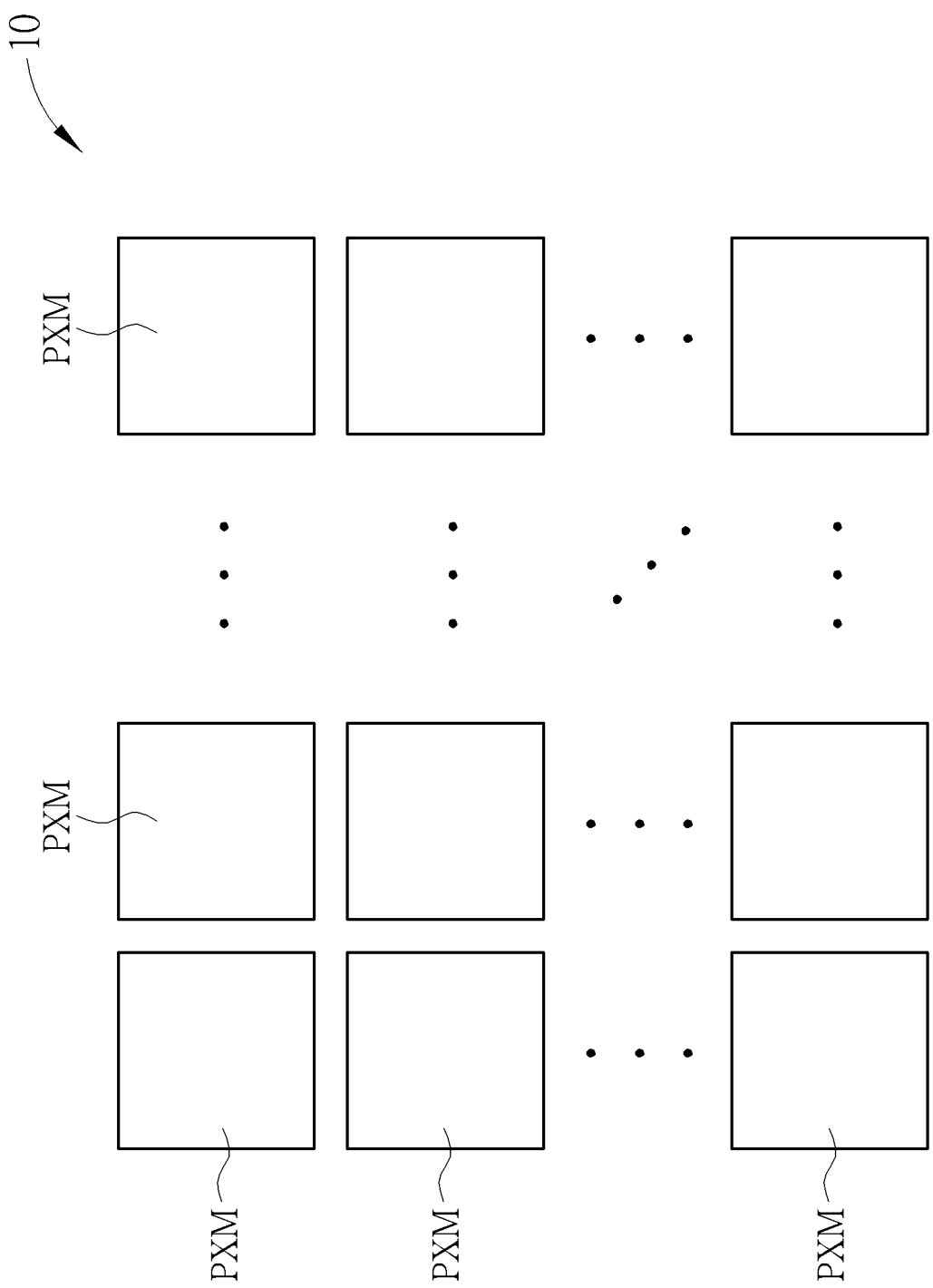
FIG. 1 is a schematic diagram of an image capturing device according to an embodiment of the present application.
Figure 2:
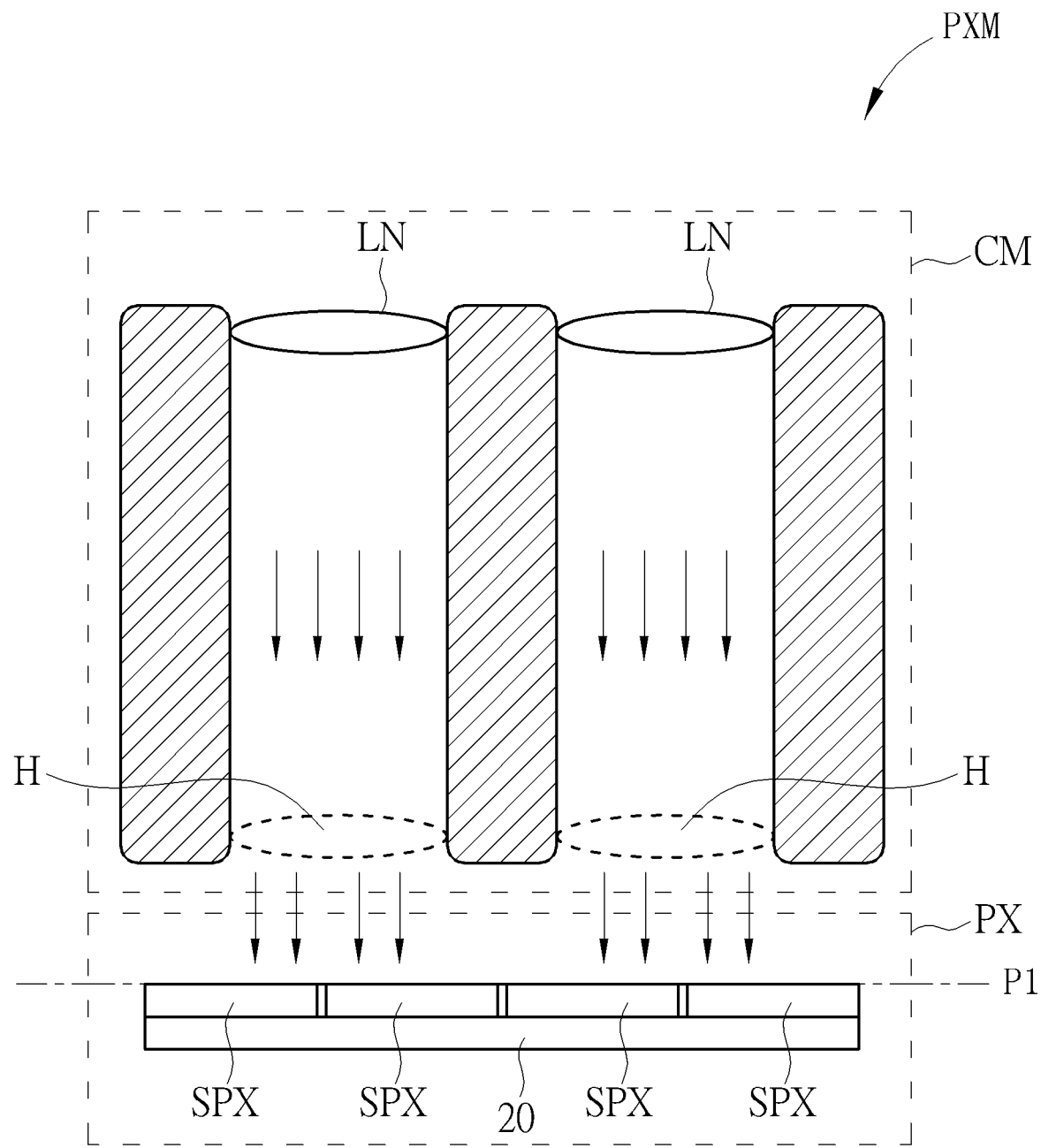
FIG. 2 is a side view of a pixel sensing module according to an embodiment of the present application.
Figure 3:
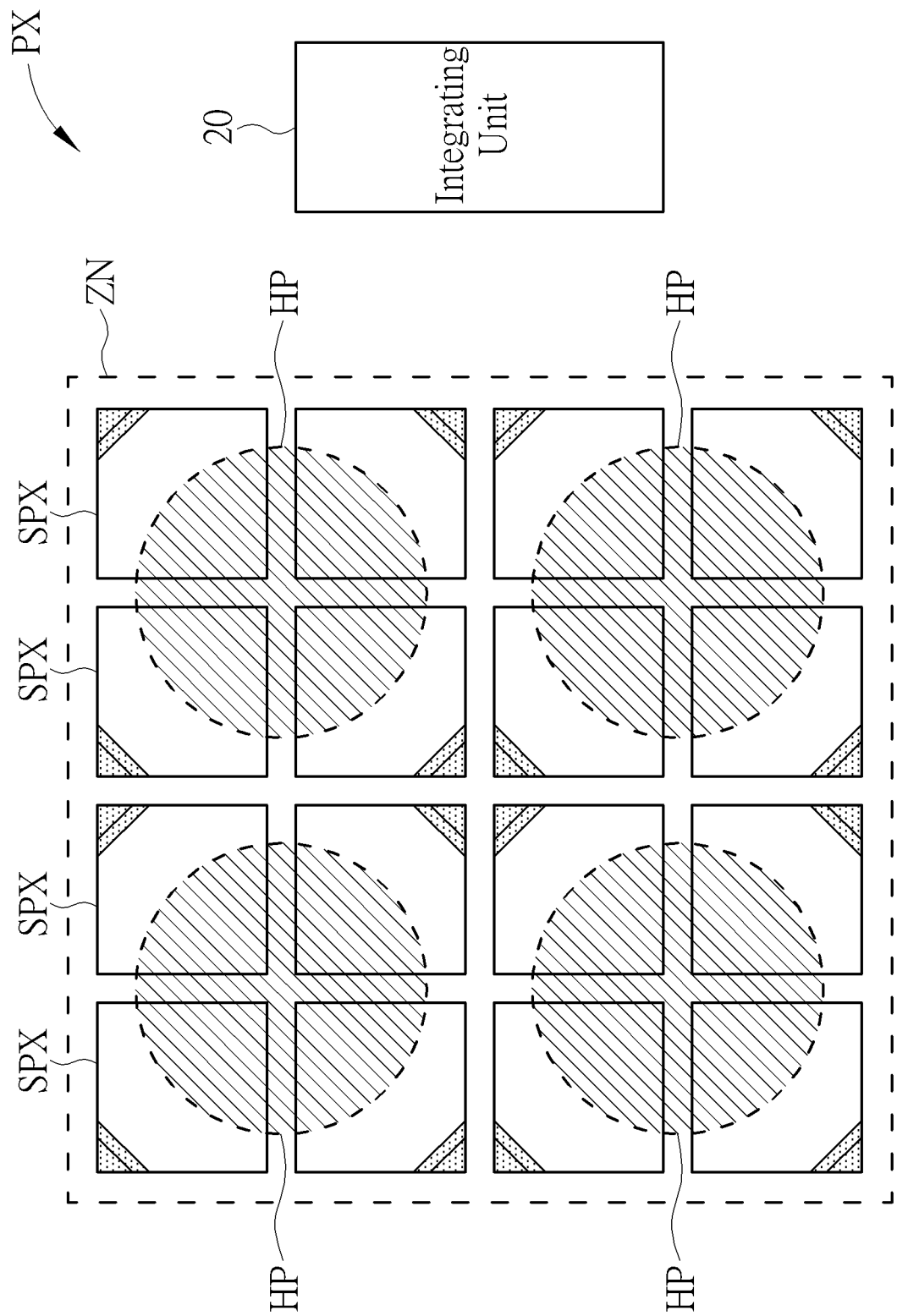
FIG. 3 is a top view of a pixel light-sensing unit according to an embodiment of the present application.

Please refer to FIG. 1 to FIG. 3. FIG. 1 is a schematic diagram of an image capturing device 10 according to an embodiment of the present application. FIG. 2 is a schematic diagram of a pixel sensing module PXM according to an embodiment of the present application. FIG. 3 is a top view of a pixel light-sensing unit PX according to an embodiment of the present application. The image capturing device 10 may be CMOS image sensor (CIS), which may be applied to a device which needs to capture images such as an optical fingerprint identification or a camera. As shown in FIG. 1, the image capturing device 10 comprises a plurality of pixel sensing modules PXM. The plurality of pixel sensing modules PXM is arranged as an array. The plurality of pixel sensing modules PXM outputs a plurality of pixel values VP corresponding to an image for the backend circuit or the device to perform an image processing or operation(s).

As shown in FIG. 2 and FIG. 3, the pixel sensing module PXM comprises the pixel light-sensing unit PX and a collimating unit CM. Each pixel light-sensing unit PX receives light at a light receiving side P1, drains out the photo electronic charges generated by the light, and outputs the pixel value VP corresponding to the pixel light-sensing unit PX. However, for the pixel light-sensing component with large light-sensing area, the photo electronic charges stored in the pixel light-sensing component are not easily drained out, such that residual electronic charges are left in the light-sensing components, and cause unnecessary image sticking effect on the image capturing device. To solve the problem of the residual photo electronic charges, the pixel light-sensing component with large light-sensing area may be partitioned into sub-pixel light-sensing components with small light-sensing area, such that the photo electronic charges are easily drained out.

In detail, the pixel light-sensing unit PX comprises a plurality of sub-pixel light-sensing components SPX and an integrating unit 20. Moreover, if the pixel light-sensing unit PX needs to have a light-sensing area to achieve a certain light sensitivity, a summation of a plurality of sub-light-sensing areas corresponding to the plurality of sub-pixel light-sensing components SPX is substantially the light-sensing area. The sub-pixel light-sensing component SPX may comprise a photo diode, which may output a corresponding sub-pixel value SVP. The integrating unit 20 is coupled to the plurality of sub-pixel light-sensing components SPX, to receive a plurality of sub-pixel values SVP corresponding to the plurality of sub-pixel light-sensing components SPX. The integrating unit 20 is configured to integrate the plurality of sub-pixel values SVP as the pixel value VP. In other words, the integrating unit 20 may output one single pixel value VP according to the plurality of sub-pixel values SVP corresponding to the plurality of sub-pixel light-sensing components SPX.

Take the pixel light-sensing unit PX illustrated in FIG. 3 as an example, the pixel light-sensing unit PX comprises 16 sub-pixel light-sensing components SPX. The 16 sub-pixel light-sensing components SPX are all located within a zone ZN at the light receiving side P1 and arranged as a 4×4 array. The 16 sub-pixel light-sensing components SPX output 16 sub-pixel values SVP to the integrating unit 20. The integrating unit 20 outputs the single pixel value VP according to the 16 sub-pixel values SVP.

In another perspective, the collimating unit CM may comprise lens LN and a plurality of openings H. The opening H is located at a light transmission portion at a bottom of the collimating unit CM. Through the lens LN and the openings H, light outside the image capturing device 10 may be transmitted through the collimating unit CM and irradiated onto the pixel light-sensing unit PX. In other words, the plurality of openings H of the collimating unit CM is aligned with the pixel light-sensing unit PX, i.e., projections of the plurality of openings H of the collimating unit CM onto the plane at which the pixel light-sensing unit PX is located (the light receiving side of the pixel light-sensing unit PX) are completely located within the zone ZN of the single pixel light-sensing unit PX at the light receiving side P1. In other words, the light transmitted through the collimating unit CM would be irradiated onto the pixel light-sensing unit PX, and would not be irradiated on adjacent pixel light-sensing units. The crosstalk between the light paths is avoided, and a maximum light amount is achieved. A projection of the openings H onto the light receiving side P1 is called as a light transmission zone HP. For example, in FIG. 3, 4 light transmission zones HP are illustrated on the 16 sub-pixel light-sensing components SPX. That is, in the current embodiment, the collimating unit CM comprises 4 openings H. Each openings H are aligned to 4 sub-pixel light-sensing components SPX. The projection of the each openings H onto the light receiving side P1 (i.e., the light transmission zone HP) is located within the zone ZN of the pixel light-sensing unit PX. In addition, even though the light transmitted through the collimating unit CM would be irradiated onto the plurality of sub-pixel light-sensing components SPX of the pixel light-sensing unit PX, the plurality of sub-pixel values SVP outputted by the plurality of sub-pixel light-sensing components SPX is corresponding to the single pixel value VP corresponding to the pixel light-sensing unit PX, which means that the light transmitted through the collimating unit CM would not cause crosstalk to the neighboring pixel light-sensing unit, such that the crosstalk between the light paths is avoided.

Figure 4:
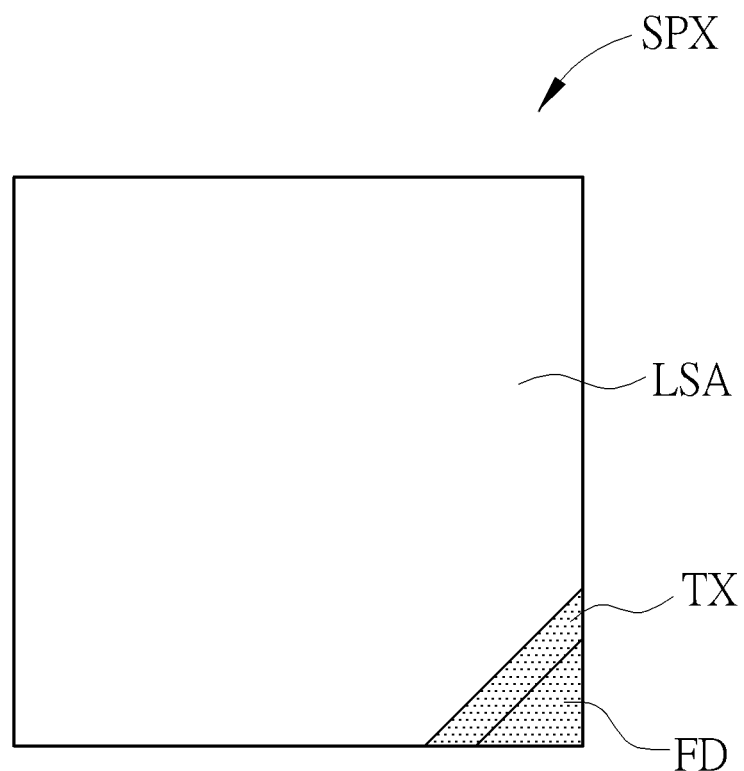
FIG. 4 is a top view of a sub-pixel light-sensing component according to an embodiment of the present application.

Furthermore, please refer to FIG. 4. FIG. 4 is a layout schematic diagram (top view) of a sub-pixel light-sensing component SPX according to an embodiment of the present application. The sub-pixel light-sensing component SPX may comprise a light-sensing area LSA, a transmission gate TX and a floating node FD. The light-sensing area LSA receives light and produces photo electronic charges. The transmission gate TX is configured to apply a signal $S_{TX}$ to drain out the photo electronic charges stored in the light-sensing area LSA to the floating node FD, and the sub-pixel value SVP is related to an amount of the photo electronic charges in the floating node FD of the sub-pixel light-sensing component SPX.

Since the light-sensing area LSA receives light and a location of which is related to the light sensitivity of the sub-pixel light-sensing component SPX. The transmission gate TX and the floating node FD do not receive light and a location of which is irrelevant to the light sensitivity of the sub-pixel light-sensing component SPX. Hence, the location of the transmission gate TX and the floating node FD at the light receiving side P1 may be regarded as the non-light-sensing area of the sub-pixel light-sensing component SPX. In this case, to enhance the light sensitivity of the pixel light-sensing unit PX, an arrangement of the plurality of sub-pixel light-sensing components SPX of the pixel light-sensing unit PX may be adjusted, such that the light transmission zone HP, the projection of the openings H onto the light receiving side P1 of the pixel light-sensing unit PX, only overlaps with the light-sensing areas LSA of the plurality of sub-pixel light-sensing components SPX, and the light transmission zone HP does not overlap with the non-light-sensing areas of the plurality of sub-pixel light-sensing components SPX. Therefore, the pixel light-sensing unit PX would have better light sensitivity.

In addition, the method of the integrating unit 20 integrating the plurality of sub-pixel values SVP as the pixel value VP is not limited. In an embodiment, the integrating unit 20 may perform an average operation on the plurality of sub-pixel values SVP, to output the pixel value VP as an average of the plurality of sub-pixel values SVP. In an embodiment, the integrating unit 20 may perform a summation operation on the plurality of sub-pixel values SVP, to output the pixel value VP as a summation of the plurality of sub-pixel values SVP. In an embodiment, the integrating unit 20 may choose one sub-pixel value SVP among the plurality of sub-pixel values SVP to be the pixel value VP, and output the pixel value VP as the chosen sub-pixel value SVP.

Notably, the embodiments stated in the above are utilized for illustrating the concept of the present application. Those skilled in the art may make modifications and alterations accordingly, and not limited herein. For example, in the present application, the sub-pixel light-sensing components of the pixel light-sensing unit are not limited to be arranged as the 4×4 array. The pixel light-sensing unit is not limited to including 16 sub-pixel light-sensing components. The sub-pixel light-sensing components within the pixel light-sensing unit may be arranged in different ways, depending on the practical situation, and not limited thereto.

In summary, the present application utilizes the collimating unit having a plurality of openings aligned with the zone of each pixel light-sensing unit at the light receiving side so as to avoid crosstalk between the light paths and achieve the maximum light amount; and utilizes the plurality of sub-pixel light-sensing components of the pixel light-sensing unit to enhance the draining-out capability. Furthermore, the present application arranges the sub-pixel light-sensing components appropriately, such that the projections of the openings at the light receiving side (i.e., the light transmission zone) only overlap with the light-sensing areas of the sub-pixel light-sensing components and do not overlap with the non-light-sensing area of the plurality of sub-pixel light-sensing components, to achieve better light sensitivity.

The foregoing is only embodiments of the present application, which is not intended to limit the present application. Any modification following the spirit and principle of the present application, equivalent substitutions, improvements should be included within the scope of the present application.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel sensing module, characterized by, comprising:
   a pixel light-sensing unit, for receiving light at a light receiving side and outputting a pixel value, the pixel light-sensing unit comprising:
      a plurality of sub-pixel light-sensing components, configured to output a plurality of sub-pixel values, wherein each sub-pixel light-sensing component comprises a light-sensing area, a transmission gate and a floating node, and the transmission gate and the floating node are arranged in a non-light-sensing area; and
      an integrating unit, coupled to the pixel light-sensing unit, configured to output the pixel value according to the plurality of sub-pixel values; and
   a collimating unit, having a plurality of openings, wherein the plurality of openings are aligned with an area of the pixel light-sensing unit, and projections of the plurality of openings onto the light receiving side lie within the area of the pixel light-sensing unit at the light receiving side;
   wherein a projection of an opening overlaps with a plurality of first light-sensing areas corresponding to a plurality of first sub-pixel light-sensing components among the plurality of sub-pixel light-sensing components, and the projection of the opening does not overlap with a plurality of first non-light-sensing areas corresponding to the plurality of first sub-pixel light-sensing components.

2. The pixel sensing module of claim 1, characterized in that, a first opening among the plurality of openings is aligned with at least a sub-pixel light-sensing component among the plurality of sub-pixel light-sensing components.

3. The pixel sensing module of claim 2, characterized in that, the plurality of sub-pixel light-sensing components comprises a plurality of light-sensing areas and a plurality of non-light-sensing areas, and a projection of the first opening onto the light receiving side coincides with at least a light-sensing area of the at least a sub-pixel light-sensing component.

4. The pixel sensing module of claim 1, characterized in that, the plurality of sub-pixel light-sensing components comprises photo diodes.

5. The pixel sensing module of claim 1, characterized in that, the integrating unit performs an average operation on the plurality of sub-pixel values, to output the pixel value as an average of the plurality of sub-pixel values.

6. The pixel sensing module of claim 1, characterized in that, the integrating unit performs a summation operation on the plurality of sub-pixel values, to output the pixel value as a summation of the plurality of sub-pixel values.

7. The pixel sensing module of claim 1, characterized in that, the integrating unit outputs the pixel value as a sub-pixel value among the plurality of sub-pixel values.

8. The pixel sensing module of claim 1, characterized in that, the plurality of sub-pixel light-sensing components of the pixel light-sensing unit arranged in a sub-array, each of the openings of the collimating unit is aligned with at least one sub-pixel light-sensing components in the sub-array, and the projections of the plurality of openings onto the light receiving side are not overlapped with each other.

9. The pixel sensing module of claim 8, characterized in that, the pixel light-sensing unit comprises N*N sub-pixel light-sensing components, the N*N sub-pixel light-sensing components are formed as multiple sub-pixel groups, each of the sub-pixel groups comprises M*M sub-pixel light-sensing components;
 each of the openings of the collimating unit is aligned with a sub-pixel group;
 wherein N, M are both integer greater than one, and M<N.

10. The pixel sensing module of claim 9, characterized in that, wherein the pixel light-sensing unit comprises 16 sub-pixel light-sensing components, and N=4, M=2.

11. The pixel sensing module of claim 1, characterized in that, the non-light-sensing area is located at a corner region of the sub-pixel light-sensing components; wherein the opening of the collimating unit is arranged in such a manner that light transmitted through the opening is irradiated onto the plurality of first light-sensing areas of the plurality of first sub-pixel light-sensing components of a corresponding sub-pixel group, without being irradiated onto the plurality of first non-light-sensing areas.

12. The pixel sensing module of claim 11, characterized in that, the transmission gate is arranged between the light-sensing area and the floating node.

13. The pixel sensing module of claim 12, characterized in that, the light-sensing area is configured to receive light and produces photo electronic charges, the transmission gate is configured to apply a signal to drain out the photo electronic charges stored in the light-sensing area to the floating node, wherein a sub-pixel value of the sub-pixel light-sensing component is related to an amount of the photo electronic charges in the floating node.

14. The pixel sensing module of claim 1, characterized in that, the collimating unit further comprises a plurality of lenses, each of the lenses is arranged at a respective opening of the collimating unit.

15. An image capturing device, characterized by, comprising:
 a plurality of pixel sensing modules, arranged as an array, wherein each pixel sensing module comprises:
 a pixel light-sensing unit, for receiving light at a light receiving side and outputting a pixel value, the pixel light-sensing unit comprising:
  a plurality of sub-pixel light-sensing components, configured to output a plurality of sub-pixel values, wherein each sub-pixel light-sensing component comprises a light-sensing area, a transmission gate and a floating node, and the transmission gate and the floating node are arranged in a non-light-sensing area; and
 an integrating unit, coupled to the pixel light-sensing unit, configured to output the pixel value according to the plurality of sub-pixel values; and
 a collimating unit, comprising at least one opening, wherein the at least one opening is aligned with an area of the pixel light-sensing unit, and a projection of the at least one opening onto the light receiving side lie within the area of the pixel light-sensing unit at the light receiving side;
 wherein a projection of an opening overlaps with a plurality of first light-sensing areas corresponding to a plurality of first sub-pixel light-sensing components among the plurality of sub-pixel light-sensing components, and the projection of the opening does not overlap with a plurality of first non-light-sensing areas corresponding to the plurality of first sub-pixel light-sensing components.

16. The image capturing device of claim 15, characterized in that, the plurality of sub-pixel light-sensing components of the pixel light-sensing unit arranged in a sub-array, each of the openings of the collimating unit is aligned with at least one sub-pixel light-sensing components in the sub-array, and the projections of the plurality of openings onto the light receiving side are not overlapped with each other.

17. The image capturing device of claim 16, characterized in that, the pixel light-sensing unit comprises N*N sub-pixel light-sensing components, the N*N sub-pixel light-sensing components are formed as multiple sub-pixel groups, each of the sub-pixel groups comprises M*M sub-pixel light-sensing components;
 each of the openings of the collimating unit is aligned with a sub-pixel group;
 wherein N, M are both integer greater than one, and M<N.

18. The image capturing device of claim 17, characterized in that, the non-light-sensing area is located at a corner region of the sub-pixel light-sensing components; wherein the opening of the collimating unit is arranged in such a manner that light transmitted through the opening is irradiated onto the plurality of first light-sensing areas of the plurality of first sub-pixel light-sensing components of a corresponding sub-pixel group, without being irradiated onto the plurality of first non-light-sensing areas.

19. The image capturing device of claim 15, characterized in that, the transmission gate is arranged between the light-sensing area and the floating node; wherein the light-sensing area is configured to receive light and produces photo electronic charges, the transmission gate is configured to apply a signal to drain out the photo electronic charges stored in the light-sensing area to the floating node, wherein a sub-pixel value of the sub-pixel light-sensing component is related to an amount of the photo electronic charges in the floating node.

20. The image capturing device of claim 15, characterized in that, the collimating unit further comprises a plurality of lenses, each of the lenses is arranged at a respective opening of the collimating unit.

* * * * *